(12) United States Patent
Muramatsu et al.

(10) Patent No.: US 9,741,647 B2
(45) Date of Patent: Aug. 22, 2017

(54) WIRING SUBSTRATE, SEMICONDUCTOR DEVICE, AND METHOD OF MANUFACTURING WIRING SUBSTRATE

(75) Inventors: Shigetsugu Muramatsu, Nagano-Ken (JP); Noritaka Katagiri, Nagano-Ken (JP)

(73) Assignee: Shinko Electric Industries Co., LTD., Nagano-Ken (JP)

( * ) Notice: Subject to any disclaimer, the term of this patent is extended or adjusted under 35 U.S.C. 154(b) by 340 days.

(21) Appl. No.: 13/293,857

(22) Filed: Nov. 10, 2011

(65) Prior Publication Data
US 2012/0119377 A1    May 17, 2012

(30) Foreign Application Priority Data

Nov. 15, 2010  (JP) .................................. 2010-254494

(51) Int. Cl.
*H01L 23/498*    (2006.01)
(52) U.S. Cl.
CPC .. *H01L 23/49822* (2013.01); *H01L 23/49827* (2013.01); *H01L 2224/16225* (2013.01); *H01L 2224/16227* (2013.01); *H01L 2224/73204* (2013.01); *H01L 2924/15311* (2013.01)
(58) Field of Classification Search
CPC ..... H01L 2224/73204; H01L 23/49822; H01L 2224/16225; H01L 23/49827; H01L 2924/15311
USPC ................................... 257/774–776; 438/667
See application file for complete search history.

(56) References Cited

U.S. PATENT DOCUMENTS

| 2002/0038907 | A1* | 4/2002 | Miyamoto ........ H01L 23/49572 257/686 |
| 2005/0136646 | A1* | 6/2005 | Larnerd ................. H05K 3/429 438/629 |
| 2007/0130761 | A1 | 6/2007 | Kang et al. |
| 2008/0283277 | A1* | 11/2008 | Muramatsu et al. ......... 174/250 |

(Continued)

FOREIGN PATENT DOCUMENTS

| JP | 09-199862 | 7/1997 |
| JP | 2002-246756 | 8/2002 |

(Continued)

OTHER PUBLICATIONS

"3D Silicon Integration", 2008 IEEE.*

*Primary Examiner* — Brett Feeney
*Assistant Examiner* — Nga Doan
(74) *Attorney, Agent, or Firm* — Wolf, Greenfield & Sacks, P.C.

(57) ABSTRACT

A wiring substrate is provided with a first wiring layer including a first land, a first insulative layer formed on the first wiring layer, a second wiring layer formed on the first insulative layer, a second insulative layer formed on the second wiring layer, and a via formed extending through the first insulative layer and the second insulative layer in a thicknesswise direction. The via includes one end, which is electrically connected to the first land of the first wiring layer, and another end, which is located opposed to the one end and serves as a pad to which a mounted electronic component is electrically connected. The second wiring layer includes a coupling portion electrically connected to the via. The coupling portion of the second wiring has a width that is smaller than a diameter of the via.

12 Claims, 13 Drawing Sheets

(56) References Cited

U.S. PATENT DOCUMENTS

| | | | |
|---|---|---|---|
| 2008/0308308 A1* | 12/2008 | Kobayashi | H01L 21/4853 174/257 |
| 2009/0255722 A1 | 10/2009 | Lee et al. | |
| 2010/0101851 A1 | 4/2010 | Muramatsu et al. | |
| 2011/0193203 A1* | 8/2011 | Goto et al. | 257/659 |
| 2011/0240356 A1* | 10/2011 | Wakita | H05K 3/4644 174/264 |

FOREIGN PATENT DOCUMENTS

| | | |
|---|---|---|
| JP | 2004-273575 | 9/2004 |
| JP | 2010-103435 | 6/2010 |

\* cited by examiner

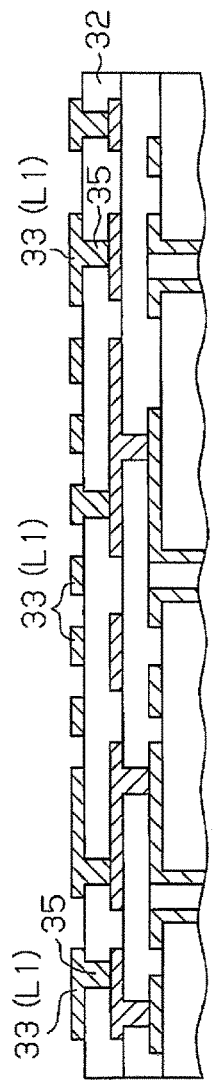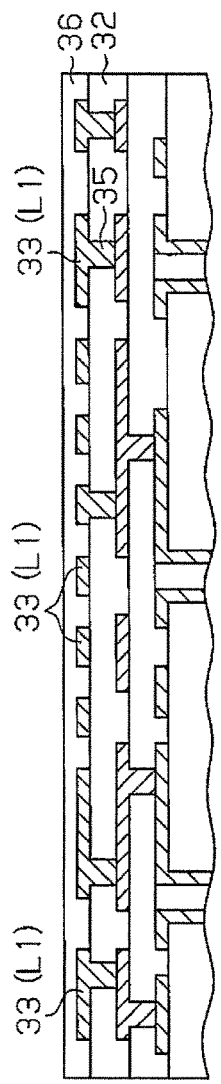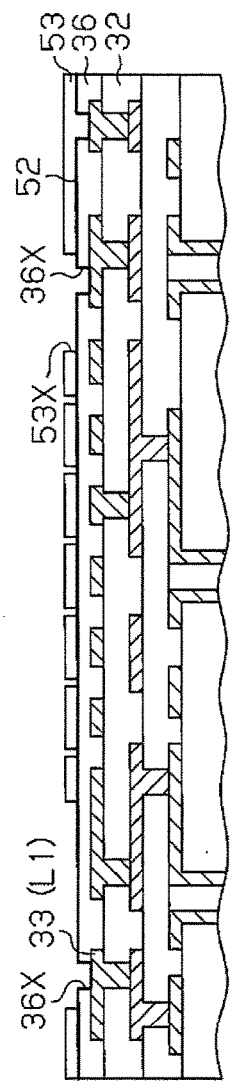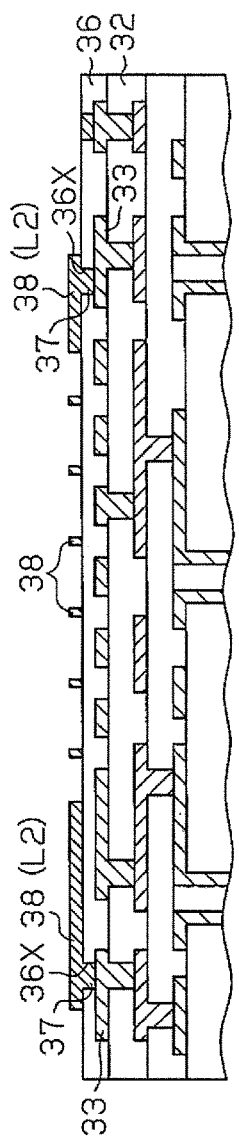

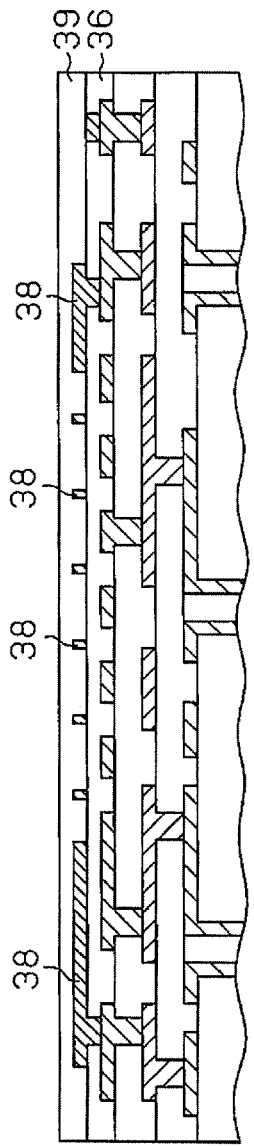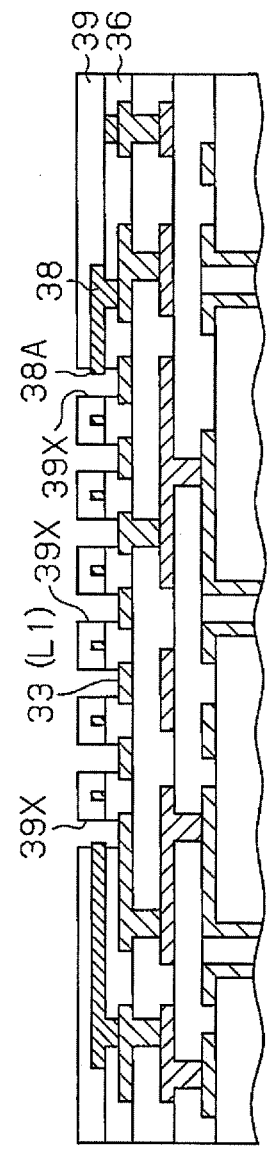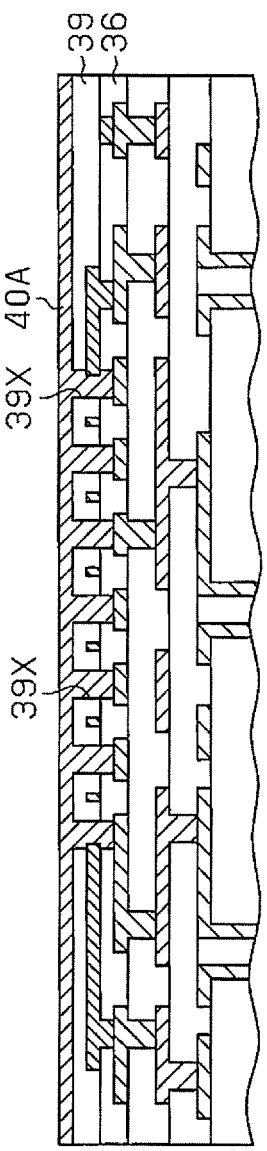

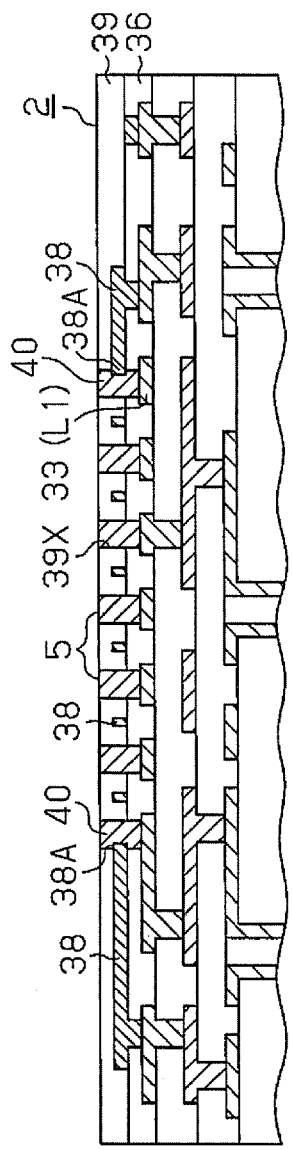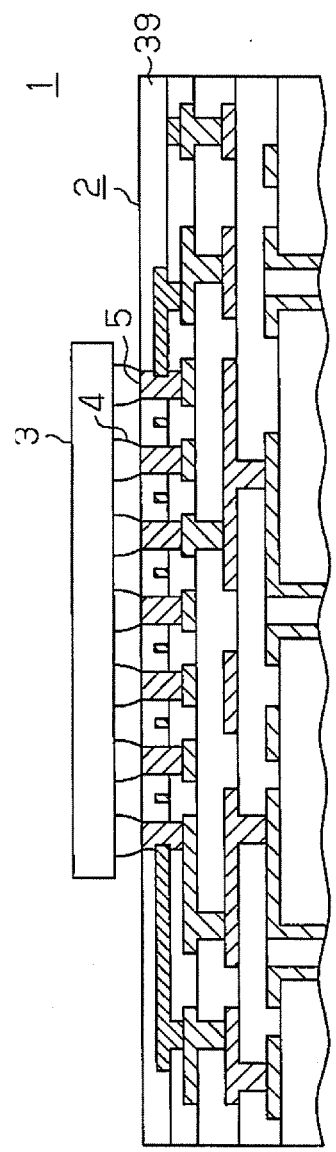

WIRING SUBSTRATE, SEMICONDUCTOR DEVICE, AND METHOD OF MANUFACTURING WIRING SUBSTRATE

CROSS-REFERENCE TO RELATED APPLICATIONS

This application is based upon and claims the benefit of priority from prior Japanese Patent Application No. 2010-254494, filed on Nov. 15, 2010, the entire contents of which are incorporated herein by reference.

BACKGROUND OF THE INVENTION

The present invention relates to a wiring substrate, a semiconductor device, and a method for manufacturing the wiring substrate.

When mounting a component such as a semiconductor chip on a wiring substrate, an insulating material referred to as a solder resist is applied to the outermost layer of the wiring substrate to protect the wiring substrate from solder, contamination, and the like. In this case, an opening for exposing a wiring layer under the solder resist is formed in the wiring substrate to form a coupling pad (e.g., flip-chip pad) that is necessary for coupling with the mounting component. Photolithography, for example, is performed to form the opening.

Referring to FIG. 1A, a core substrate 60 is first prepared. Then, the required number of wiring layers 61 and 62 and insulative layers 63 and 64, which respectively cover the wiring layers 61 and 62 are formed on a core substrate 60. A wiring layer 65, which serves as an uppermost layer, and an insulative layer (solder resist layer 66), which covers the wiring layer 65, are then formed. Photolithography is performed to expose and develop the solder resist layer 66. As shown in FIG. 1B, this forms openings 66X of a predetermined pattern. The openings 66X expose parts of the wiring layer 65 in the uppermost layer as coupling pads 65a. In this manner, the pads 65a are formed by openings in the solder resist layer 66.

Japanese Laid-Open Patent Publication No. 2002-246756 describes an example of the above-described prior art.

Due to the increasing scale of integration in semiconductor chips, the number of coupling terminals in a semiconductor chip that is connected to a wiring substrate is increasing, that is, the number of pins is increasing. (greater number of pins). Further, the pitch between coupling terminals in a semiconductor chip has become narrower. Accordingly, miniaturization of a pad structure of a wiring substrate has become necessary. In particular, a higher wire density is required in the uppermost layer of a wiring substrate. To increase the wire density, it is significant that the regions of the wiring layer 65 arranged between the pads 65a be as large as possible.

As shown in the perspective view of FIG. 2, the wiring layer 65 in the uppermost layer of the wiring substrate includes lands L, each having a larger diameter than the openings 66X. This obtains each pad 65a with a desired diameter without the corresponding opening 66X (refer to broken line) of the solder resist layer 66 being separated from the wiring layer 65. As shown in FIG. 3B, such a land L is formed in the same manner regardless of whether a via 67, which electrically connects the corresponding pad 65a to the inner wiring layer 62, is arranged directly below the pad 65a (refer to left side in FIG. 3B) or whether the via 67 is separated from the corresponding pad 65a and located below a part of the wiring layer 65 extended outward from the pad 65a (refer to right side in FIG. 3B). Thus, as shown in FIG. 3A, each pad 65a includes a land L having a diameter D2 that is greater than a diameter D1 of the pad 65a. Accordingly, the lands L decrease the width WB of the region in which the wiring layer 65 can be arranged between pads 65a. Thus, the wire density cannot be increased.

SUMMARY OF THE INVENTION

One aspect of the present invention is a wiring substrate provided with a first wiring layer including a first land. A first insulative layer is formed on the first wiring layer. A second wiring layer is formed on the first insulative layer. A second insulative layer is formed on the second wiring layer. A via is formed extending through the first insulative layer and the second insulative layer in a thicknesswise direction. Further, the via includes one end, which is electrically connected to the first land of the first wiring layer, and another end, which is located opposed to the one end and serves as a pad to which a mounted electronic component is electrically connected. The second wiring layer includes a coupling portion electrically connected to the via. The coupling portion of the second wiring layer has a width that is smaller than a diameter of the via.

A further aspect of the present invention is a semiconductor device including a wiring substrate and a semiconductor chip which serves as a mounted electronic component. The wiring substrate is provided with a first wiring layer including a land. In the wiring substrate, a first insulative layer is formed on the first wiring layer. A second wiring layer is formed on the first insulative layer. A second insulative layer is formed on the second wiring layer. A via is formed extending through the first insulative layer and the second insulative layer in a thicknesswise direction. The via includes one end, which is electrically connected to the land of the first wiring layer, and another end, which is located opposed to the one end and serves as a pad to which the semiconductor chip is electrically connected. The second wiring layer includes a coupling portion electrically connected to the via. The coupling portion of the second wiring layer has a width that is smaller than a diameter of the via. The semiconductor chip is electrically flip-chip connected to the pad.

Another aspect of the present invention is a method for manufacturing a wiring substrate. The method includes forming a first insulative layer on a first wiring layer including a first land, forming a second wiring layer including a coupling portion on the first insulative layer, forming a second insulative layer on the second wiring layer, and forming a via hole that extends through the first insulative layer and the second insulative layer to the first land of the first wiring layer at a location facing the coupling portion. The via hole has a larger diameter than the coupling portion. The method further includes filling the via hole with a conductive layer to form a via to electrically connect the via to the first wiring layer and the second wiring layer.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIGS. 10A to 10D are schematic cross-sectional views showing the method for manufacturing the semiconductor device of the first embodiment;

FIGS. 11A to 11C are schematic cross-sectional views showing the method for manufacturing the semiconductor device of the first embodiment;

FIGS. 12A and 12B are schematic cross-sectional views showing the method for manufacturing the semiconductor device of the first embodiment;

DETAILED DESCRIPTION OF THE INVENTION

One embodiment will now be described with reference to the accompanying drawings. The accompanying drawings schematically illustrate structure and are not in scale with the actual size. In the cross-sectional views, to facilitate understanding of the cross-sectionals structure of each member, hatching lines are not used for insulative layers.

Figure 4A:
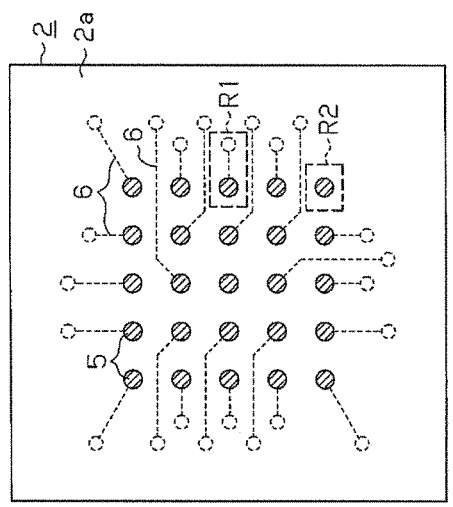
FIG. 4A is a plan view showing a wiring substrate of a first embodiment.
Figure 4B:
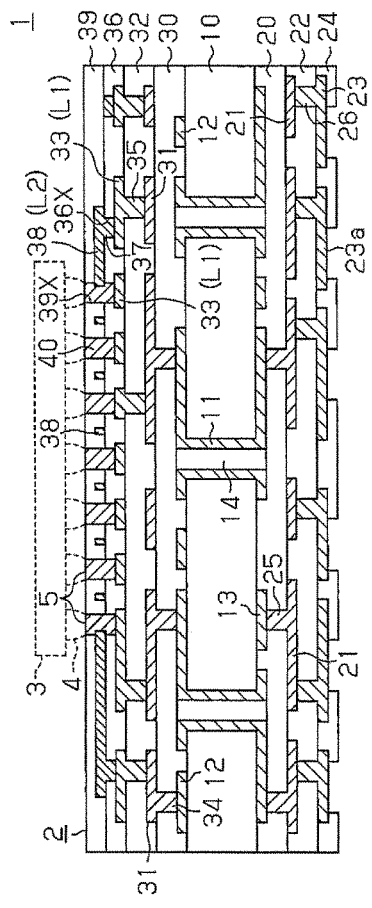
FIG. 4B is a cross-sectional view showing a semiconductor device in the first embodiment.

As shown in FIG. 4B, a semiconductor device 1 of the present embodiment includes a wiring substrate 2 and a semiconductor chip 3, which is mounted on the wiring substrate 2. The semiconductor chip 3 includes a circuit formation surface (lower surface in FIG. 4B). Bumps 4 are arranged on the circuit formation surface in a matrix as viewed from above. The semiconductor chip 3 is an example of a mounted electronic component.

First, the structure of the wiring substrate 2 will be described in detail.

As shown in FIG. 4A, the wiring substrate 2 includes a mounting surface 2a on which the semiconductor chip 3 is mounted. The mounting surface 2a includes coupling pads 5, which are flip-chip connected to the bumps 4 of the semiconductor chip 3. The coupling pads 5 are arranged in a matrix as viewed from above. The coupling pads 5 are arranged in correspondence with the arrangement of the bumps 4.

Redistribution wires 6, which extend outward from pads 5, are formed on the wiring substrate 2. The redistribution wires 6 extending from the pads 5 formed in an inner region of the wiring substrate 2 pass between the outer pads 5, which are formed in the region outward from the inner pads 5.

As shown in FIG. 4B, the wiring substrate 2 includes a core substrate 10, which has an upper surface and a lower surface. The wiring substrate 2 has a multi-layer structure including a plurality of insulative layers and a plurality of wiring layers that are stacked on the upper and lower surfaces of the core substrate 10.

The core substrate 10 includes through-holes 11 formed at certain locations. Wiring layers 12 and 13 formed on the core substrate 10 are connected to each other by the through-holes 11. The through-holes 11 are filled with resin 14. Copper (Cu), for example, may be used as the material of the wirings 12 and 13.

An insulative layer 20, which covers the wiring layer 13, is formed on the lower surface of the core substrate 10. A wiring layer 21 having a predetermined pattern is formed under the insulative layer 20. An insulative layer 22 covers the wiring layer 21. A wiring layer 23 having a predetermined pattern is formed under the insulative layer 22. An insulative layer 24 is formed under the insulative layer 22 and the wiring layer 23. In the present example, the insulative layer 24 serves as a solder resist layer. Vias 25 are formed in the insulative layer 20. Each via 25 includes one end connected to the wiring layer 13 and another end connected to the wiring layer 21. In the same manner, vias 26 are formed in the insulative layer 22. Each via 26 has one end connected to the wiring layer 21 and another end connected to the wiring layer 23. Further, parts of the wiring layer 23 is exposed from the insulative layer 24 (solder resist layer) to form external coupling pads 23a. The external coupling pads 23a are used for coupling to external coupling terminals, which are connected to a mounting substrate (not shown), such as a motherboard.

Copper, for example, may be used as the material for the wiring layers 21 and 23 and the vias 25, 26. Insulative resin, such as epoxy resin or polyimide resin, may be used as the material for the insulative layers 20 and 22. A photosensitive insulative resin, for example, may be used as the material for the insulative layer 24.

An insulative layer 30, which covers the wiring layer 12, is formed on the upper surface of the core substrate 10. A wiring layer 31 having a predetermined pattern is formed on the insulative layer 30. An insulative layer 32 covers the wiring layer 31. A first wiring layer 33 is formed on the insulative layer 32. Vias 34 are formed in the insulative layer 30. Each via 34 includes one end connected to the wiring layer 12 and another end connected to the wiring layer 31. In the same manner, vias 35 are formed in the insulative layer 32. Each via 35 has one end connected to the wiring layer 31 and another end connected to the wiring layer 33. Copper, for example, may be used as the material for the wiring layers 31 and 33 and the vias 34 and 35. Insulative resin, such as epoxy resin and polyimide resin, may be used as the material for the insulative layers 30 and 32.

Figure 6:
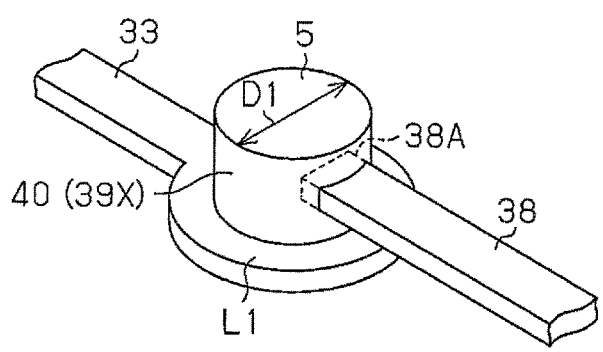
FIG. 6 is a schematic perspective view showing the coupling of a pad in the wiring substrate of the first embodiment.

The first wiring layer 33 includes lands L1 (refer to also FIG. 6). The lands L1 is an example of a first land. As shown in FIG. 4B, a first insulative layer 36 is laminated on the first wiring layer 33 to cover the first wiring layer 33. The first insulative layer 36 includes via holes 36X extending to the lands L1 of the first wiring layer 33 at a plurality of locations. The via holes 36X have a smaller diameter than lands L1 in the first wiring layer 33. Thus, when a via hole 36X is formed with a laser in the first wiring layer 33, the laser stably forms the via hole 36X within the region of the corresponding land L1 and does not separate the via hole 36X from the land L1. Each via hole 36X is filled with a conductive layer (copper plated layer) to form a via 37.

A second wiring layer 38, which has a predetermined pattern, and a second insulative layer 39, which covers the second wiring layer 38, are laminated on the first insulative layer 36. The second wiring layer 38 is electrically connected to the vias 37 by lands L2. The lands L2 have a larger diameter than the via holes 36X so that the second wiring layer 38 is not separated from the via holes 36X.

Copper, for example, may be used as the material for the vias 37 and the second wiring layer 38. A photosensitive material and a non-photosensitive material may both be used as the material for the insulative layers 36 and 39. As the insulative layers 36 and 39, for example, sheets of insulative resin in a viscous B-stage state (half-cured state), a paste of insulative resin in the viscous B-stage state, a build-up resin (epoxy resin including a filler or epoxy resin free from a filler), a liquid crystal polymer, or the like may be used.

Via holes 39X that reach the lands L1 of the first wiring layer 33 are formed in the first insulative layer 36 and the second insulative layer 39 at a plurality of locations where the pads 5 are formed. The via holes 39X extend through the first insulative layer 36 and the second insulative layer 39 in a thicknesswise direction. Some of the via holes 39X are in contact with parts of the second wiring layer 38. Each via hole 39X is filled with a conductive layer (copper plated layer) to form a via 40. Thus, the via 40 fills the corresponding via hole 39X and extends in the thicknesswise direction through the first insulative layer 36 and the second insulative layer 39 to be electrically connected to the first wiring layer 33. Some of the vias 40 are electrically connected to the second wiring layer 38.

Each via 40 includes a pad 5. In the present example, the end face (upper surface) of the via 40 exposed from the second insulative layer 39 serves as the pad 5. The upper surface of the pad 5 is flush with the upper surface of the second insulative layer 39. In this manner, the via 40 is a so-called landless via designed to have a diameter (e.g., 100 µm to 150 µm) that is the same as the pad 5. Copper, for example, may be used as the material for the vias 40.

In the wiring substrate 2, the pads 5 and the external coupling pads 23a are electrically connected through the wiring layers 38, 33, 31, 12, 13, and 21 and the vias 40, 37, 35, 34, 25, and 26.

The coupling structure of the pad 5 (via 40), the first wiring layer 33, and the second wiring layer 38 will now be described in detail with reference to FIGS. 5 and 6. In FIG. 6, the insulative layers are not shown to facilitate the understanding of the coupling structure.

Figure 5A:
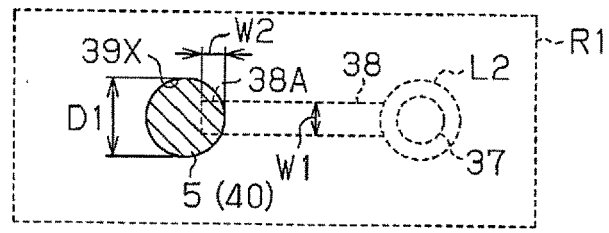
FIGS. 5A and 5C are enlarged plan views showing the wiring substrate of the first embodiment.
Figure 5B:
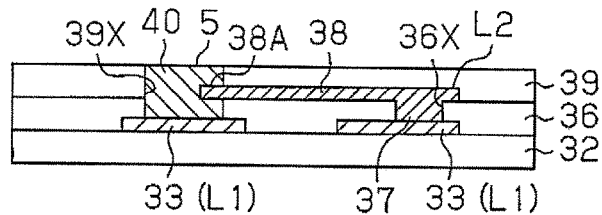
FIGS. 5B and 5D are enlarged cross-sectional views showing the wiring substrate of the first embodiment.

Referring to FIG. 5A, the coupling structure of the via 40 (pad 5) and the second wiring layer 38 will now be described (refer to, for example, region R1 in FIG. 4A). In this case, the via 40 is connected to the land L1 of the first wiring layer 33 that is located directly below the via 40, as shown in FIG. 5B. The land L1 of the first wiring layer 33 has a diameter that is greater than the diameter D1 of the via hole 39X, as also shown in FIG. 6. Thus, the via hole 39X is not separated from the land L1 even if the via hole 39X is displaced in the first wiring layer 33.

As shown in FIG. 5B, a substantially intermediate portion of the via 40 in the thicknesswise direction is connected to a coupling portion 38A of the second wiring layer 38. In the present example, the second wiring layer 38 includes a first end that projects into the via hole 39X and contacts the via 40. The first end of the second wiring layer 38 serves as the coupling portion 38A. Thus, the second wiring layer 38 is electrically connected to the via 40. As shown in FIG. 5A, the coupling portion 38A of the second wiring layer 38 has a width W1 (e.g., 15 µm) that is set to be smaller than the diameter D1 (e.g., 100 µm to 150 µm) of the via 40 (i.e., pad 5). Further, the coupling portion 38A of the second wiring layer 38 has a length W2 (e.g., 10 µm) that is set to be smaller than the diameter D1 of the via 40 (i.e., pad 5). In this manner, as also shown in FIG. 6, the coupling portion 38A of the second wiring layer 38 is connected to the via 40 by a so-called landless structure, which has smaller dimensions than the diameter D1 of the via 40.

As shown in FIGS. 5A and 5B, the second wiring layer 38 includes a second end extending outward from the via 40 (pad 5). The second end of the second wiring layer 38 forms the land L2. The second wiring layer 38 is connected to the via 37 by the land L2, which has a larger diameter than the via 37 (via hole 36X), and is also connected to the land L1 of the first wiring layer 33 through the via 37. The second wiring layer 38 corresponds to the redistribution wires 6 described above. The second wiring layer 38 allows the locations of the pads 5 to be changed relative to the external coupling pads 23a (e.g., to arrange terminals to locations according to the fan-in or any other locations for a so-called pitch conversion).

Figure 5C:
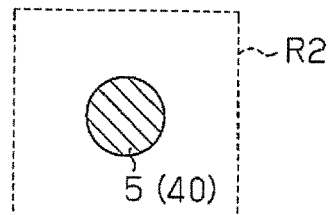
Figure 5D:
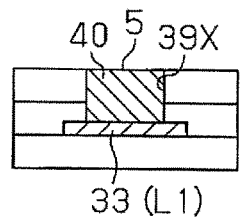

As shown in FIG. 5C, a via 40 (pad 5) that is not connected to the second wiring layer 38 will now be described (refer to, for example, region R2 in FIG. 4B). In this case, as shown in FIG. 5D, the via 40 is connected to the land L1 of the first wiring layer 33, which is located directly below the via 40. In this case, the position of the external coupling pad 23a is not changed relative to the pad 5. That is, pitch conversion is not performed. Accordingly, the position of the pad 5 (via 40) directly determines the position of the external coupling pad 23a.

The operation of the wiring substrate 2 in the structure described above will now be described.

Figure 7A:
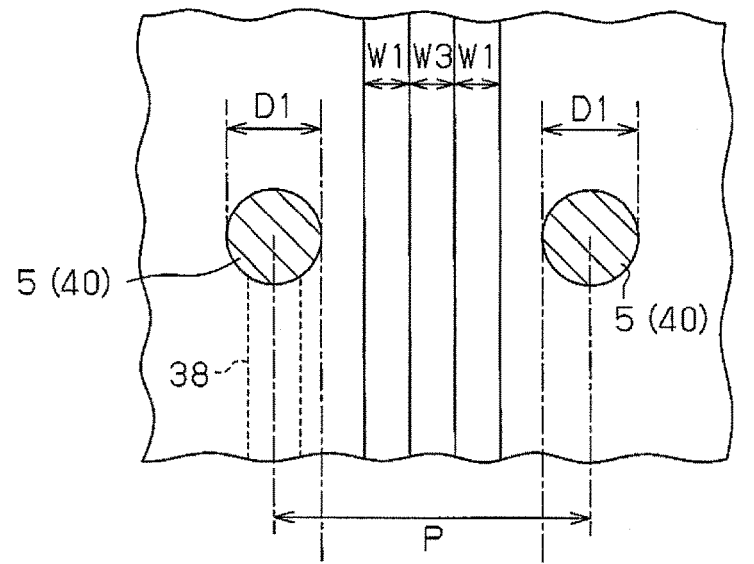
FIGS. 7A and 7B are schematic diagrams illustrating the design rule of the wiring substrate in the first embodiment.
Figure 7B:
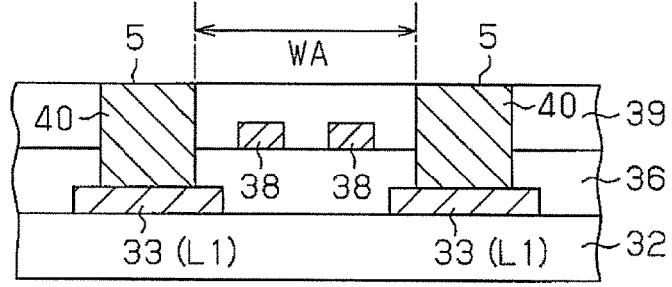

In the wiring substrate 2 of the present embodiment, the coupling portion 38A of the second wiring layer 38 is connected to the via 40 by the landless structure. Further, the second wiring layer 38, which extends from an inner via 40 located in the inner region of the wiring substrate 2, passes between adjacent outer vias 40 located in the region arranged outward from the inner via 40. In this case, regardless of which one of the coupling structures shown in FIGS. 5A to 51D is used for an outer via 40, the second wiring layer 38 extending from an inner via 40 passes between the adjacent outer vias 40 as shown in FIGS. 4A, 7A, and 7B. That is, the second wiring layer 38 is arranged to pass between vias 40 that have the same diameter as the pads 5. Thus, the region in which the second wiring layer 38 can be arranged has a larger width WA than when arranging the second wiring layer 38 between lands having a larger diameter than the diameter of the pad 5. Accordingly, a larger area of the second wiring layer 38 can be arranged in the region between the vias 40 (pad 5). Thus, the wire density can be increased.

The amount of the wiring layer 65 that can be arranged in the region between the pads 65a in the wiring substrate in the prior art and the amount of the second wiring layer 38 that can be arranged in the region between the pads 5 in the wiring substrate 2 of the present embodiment will now be compared under the same design rule.

Figure 1A:
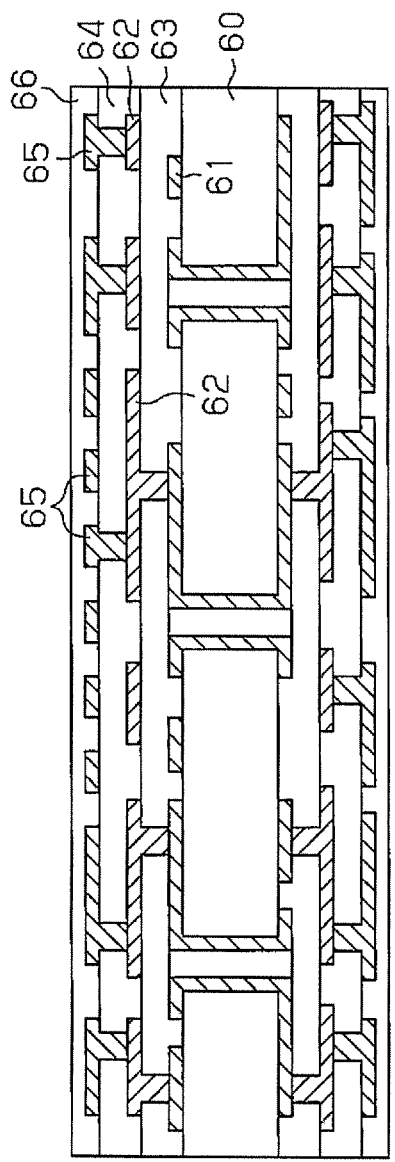
FIGS. 1A and 1B are schematic cross-sectional views showing a method for manufacturing a wiring substrate in the prior art.
Figure 1B:
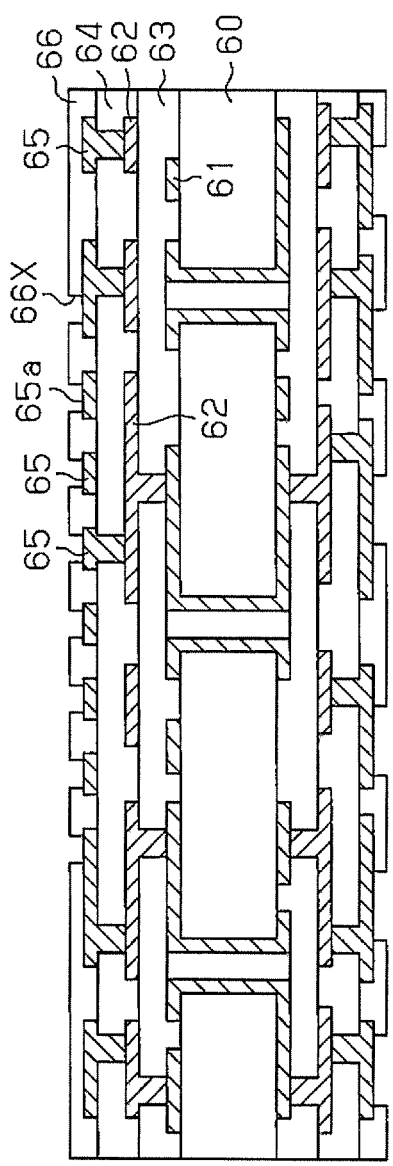
Figure 2:
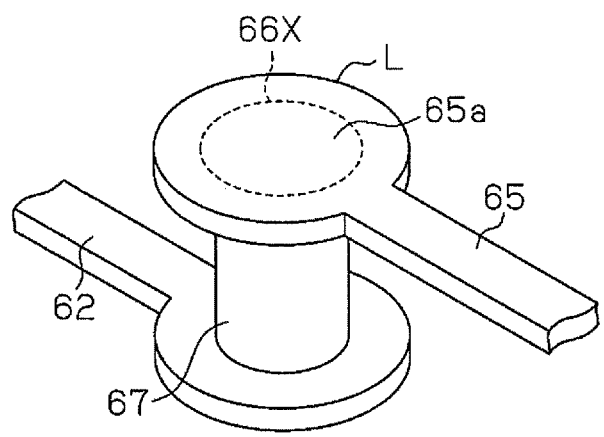
FIG. 2 is a schematic perspective view showing a the coupling of a pad in the wiring substrate of the prior art.
Figures 3A, 3B:
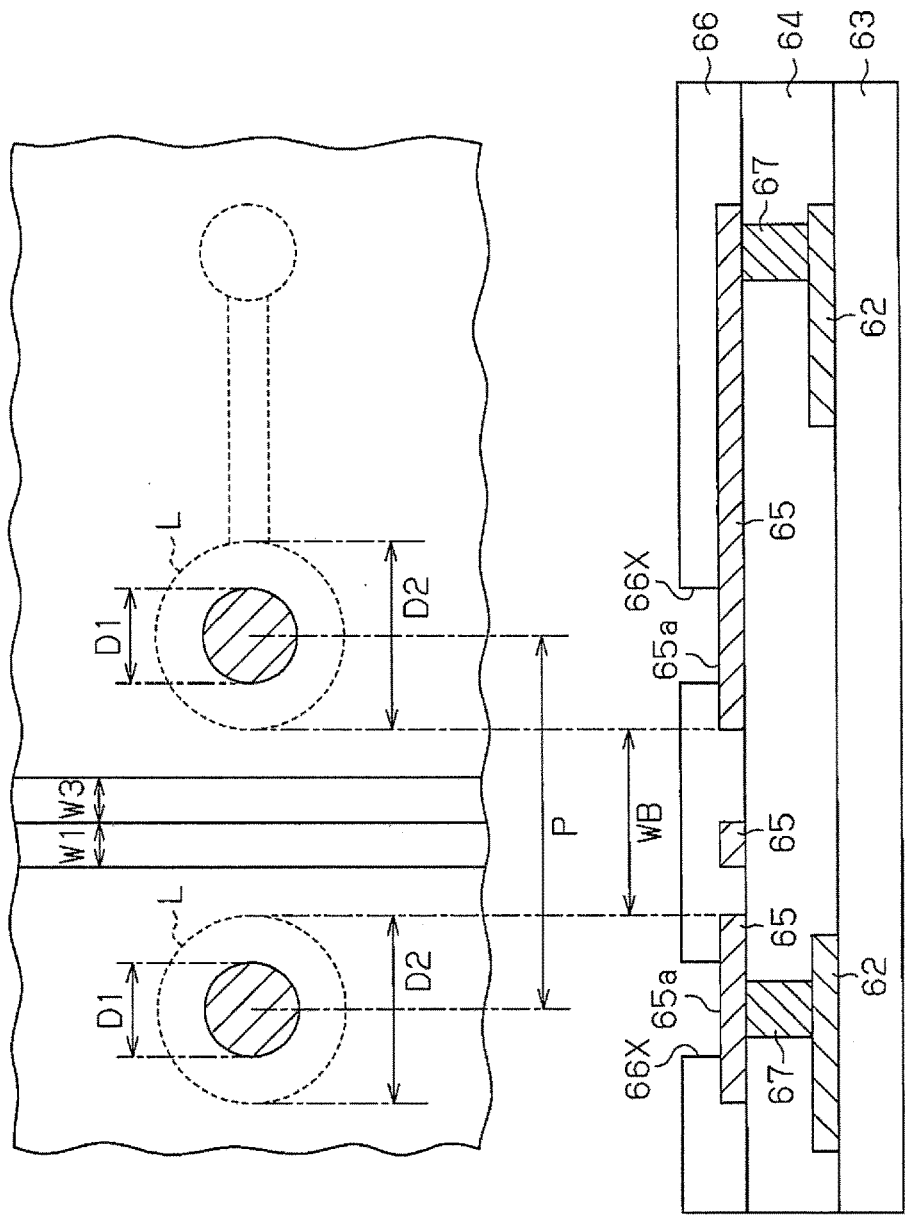
FIGS. 3A and 3B are schematic diagrams illustrating a design rule in the wiring substrate of the prior art.

First, the amount of the wiring layer 65 that can be arranged in the region between the pads 65a in the wiring substrate of the prior art will be described. In FIG. 3, a case in which the diameter D1 of the pads 65a is 100 μm, the pitch P of the pads 65a is 200 μm, and the diameter D2 of the lands L is 150 μm will be described. In this case, the width WB between the lands L is pitch P of the pads 65a (200 μm)−radius of the lands L×2 (150 μm)=50 μm. Thus, when forming a wiring layer in which the relationship of line (wire width) W1: space (width between wirings) W3 is 15 μm: 15 μm, the number of wires that can be arranged in the width WB between the lands L is 1.

In contrast, in the case of FIG. 7 showing the wiring substrate 2 of the present embodiment, when the design rule is the same as the prior art described above, the diameter D1 of the pads 5 (via 40) is 100 μm and the pitch P of the pads 5 is 200 μm. Since the coupling portion 38A of the second wiring layer 38 is connected to the via 40 by the landless structure, the width WA between the vias 40 (pads 5) in which the second wiring layer 38 can be arranged is pitch P of the pads 5 (200 μm)−radius of the pads 5×2 (100 μm)=100 μm. Thus, when forming a wiring layer in which the relationship of line (wiring width) W1: space (width between wirings) W3 is 15 μm: 15 μm, the number of wires that can be arranged in the width WA between the pads 5 is 2. In this manner, the amount of the wiring layers increases compared to the prior art described above.

As apparent from above, a larger width WA can be set between the pads 5 (vias 40) compared to the prior art by coupling the via 40 using the landless structure to the coupling portion 38A of the second wiring layer 38. Accordingly, more wires can be arranged in the region between the pads 5. Thus, the wire density can be increased. Further, for example, if a larger amount of the wiring layer can be arranged in the region between the pads 5, the number of build-up layers can be reduced. Thus, costs can be reduced, and the yield and reliability can be improved.

From a different standpoint, when forming one wire in the region between the pads 5 like in the prior art, the line: space of the wiring layer can be increased in correspondence with the increased width between the pads 5. This lowers the level of difficulty of the process. Thus, the wiring layer having a high reliability can be formed with satisfactory yield without the need for performing strict processing management.

A method for manufacturing the semiconductor device 1 will now be described with reference to FIGS. 8 to 12.

Figure 8A:
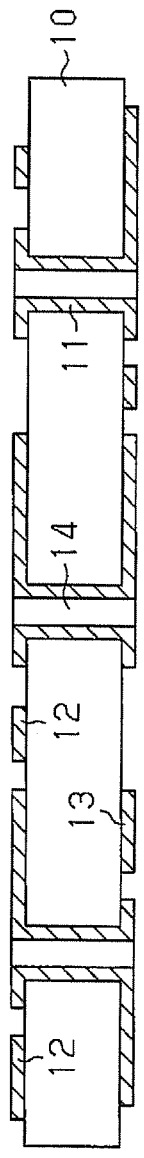
FIGS. 8A to 8D are schematic cross-sectional views showing a method for manufacturing a semiconductor device of the first embodiment.

First, the method for manufacturing the wiring substrate 2 will be described. In the method for manufacturing the wiring substrate 2 of the present embodiment, the core substrate 10, which is shown in FIG. 8A, is first prepared. The core substrate 10 is manufactured by forming through-holes in, for example, a copper clad laminated plated (CCL), and plating the walls of the through-hole to form the through-holes 11. Then, a subtractive process is performed to form the wiring layers 12 and 13. The resin 14 is filled in each through-hole 11.

Build-up wires are then formed in each of the upper surface and the lower surface of the core substrate 10. In the steps described below, only the step of forming the build-up wires on the upper side of the core substrate 10 will be described to simplify the description.

Figure 8B:
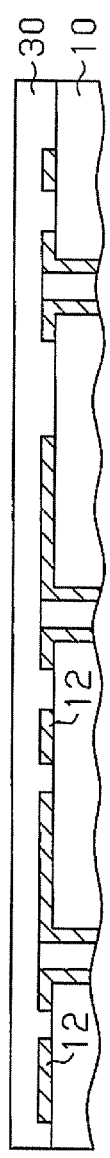
Figure 8C:
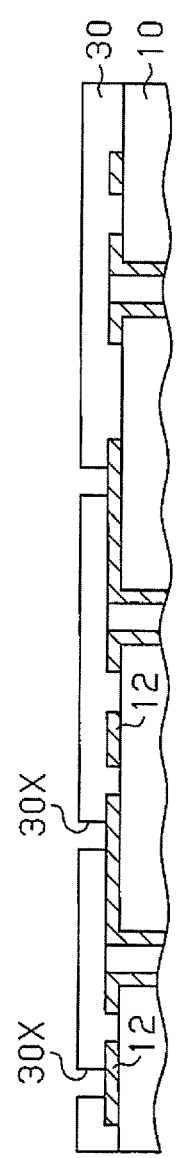

As shown in FIG. 8B, the insulative layer 30 is laminated on the core substrate 10 to cover the wiring layer 12. For example, the insulative layer 30 is formed by pressure bonding a resin film on the core substrate 10. Then, as shown in FIG. 8C, the via holes 30X are formed in the insulative layer 30 at predetermined locations to expose the end face of the wiring layer 12. The via holes 30X are formed through, for example, laser processing.

Figure 8D:
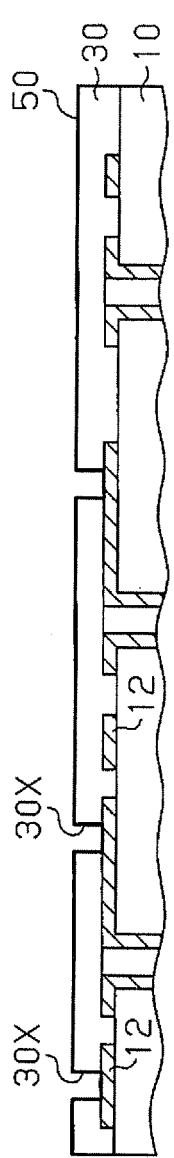
Figure 9A:
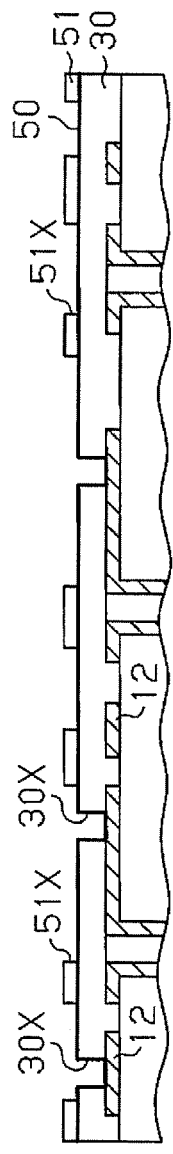
FIGS. 9A to 9D are schematic cross-sectional views showing the method for manufacturing the semiconductor device of the first embodiment.

Referring to FIG. 8D, a desmear process is performed, and then a seed layer 50 is formed on the insulative layer 30 and the walls of the via holes 30X. The seed layer 50 is formed through, for example, electroless copper plating or sputtering. Then, as shown in FIG. 9A, a dry film resist (DFR) 51 including openings 51X, which correspond to the shape of the wiring layer 31, is formed on the seed layer 50. The DFR 51 is formed through, for example, a photolithography process.

Figure 9B:
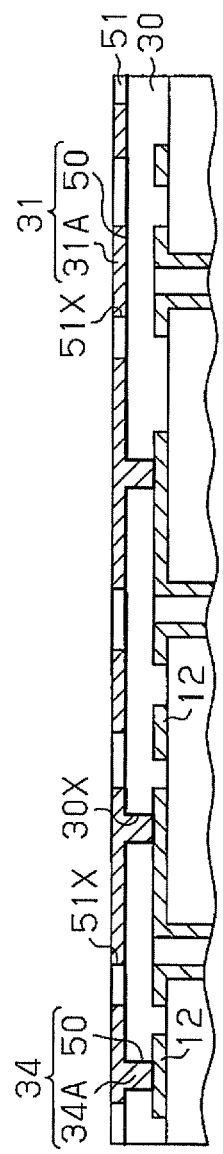
Figure 9C:
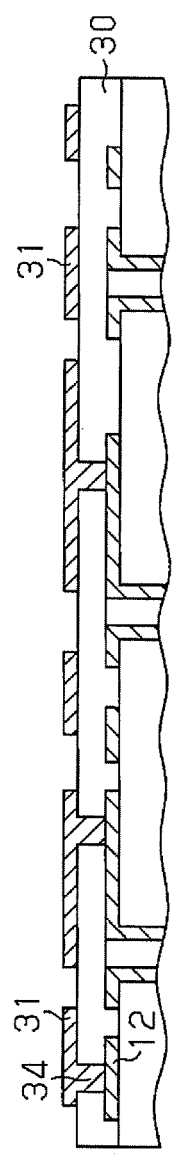

Then, as shown in FIG. 9B, electrolytic plating that uses the seed layer 50 as a power supply layer is performed to fill the via holes 30X and the openings 51X of the DFR 51 with a metal plated layer 31A of copper or the like. Here, the plating is performed on the inner side of the seed layer 50 to fill the via holes 30X with via conductors 34A. This forms the wiring layer 31 with the seed layer 50 and the metal plated layer 31A, and the seed layer 50 and the via conductors 34A form the vias 34. Then, as shown in FIG. 9C, the DFR 51 is removed, and the unnecessary seed layer 50 is etched and removed. The steps of FIGS. 8C to 9C form the wiring layer 31 and the vias 34 through the semi-additive process.

Figure 9D:
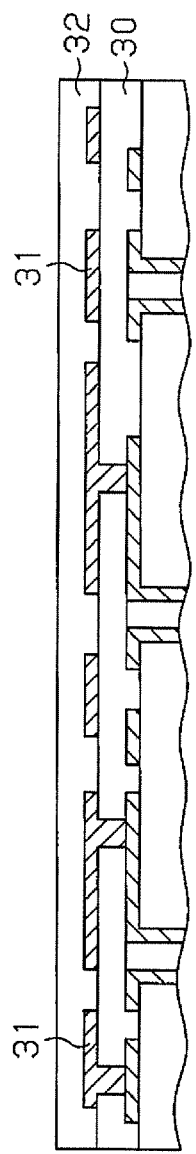

As shown in FIG. 9D, the insulative layer 32 is laminated on the insulative layer 30 to cover the wiring layer 31. For example, the insulative layer 32 is formed by pressure bonding a resin film on the insulative layer 30. Then, as shown in FIG. 10A, the first wiring layer 33 and the vias 35 are formed, for example, through the semi-additive process. The first wiring layer 33 includes the lands L1.

Next, as shown in FIG. 10B, the first insulative layer 36 is laminated on the insulative layer 32 to cover the first wiring layer 33. For example, the first insulative layer 36 is formed by pressure bonding a resin film on the insulative layer 32.

Next, as shown in FIG. 10C, the via holes 36X reaching the lands L1 of the first wiring layer 33 are formed in the first insulative layer 36 at predetermined locations. The via hole 36X are formed, for example, through laser processing. In this case, the via holes 36X have smaller diameters than the land L1. The via holes 36X are thus stably formed in the lands L1 even if the laser is displaced when forming the via hole 36X.

Then, after a desmear process is performed, a seed layer 52 is formed on the first insulative layer 36 and the walls of the via holes 36X. Then, a DFR 53 including openings 53X corresponding to the shape of the second wiring layer 38 is formed on the seed layer 52. Here, the openings 53X of the DFR 53 have a larger diameter than the via holes 36X so that the second wiring layer 38 is not separated from the via holes 36X.

Referring to FIG. 10D, electrolytic plating that uses the seed layer 52 as a power supplying layer is performed to form the vias 37 in the via holes 36X and form the second wiring layer 38 in the opening 53X of the DFR 53. The second wiring layer 38 is electrically connected to the first wiring layer 33 through the vias 37. Here, the lands L2 of the second wiring layer 38 having a larger diameter than the vias 37 is arranged on the vias 37. After forming the second wiring layer 38 and the vias 37, the DFR 53 is removed and the unnecessary seed layer 52 is etched and removed.

Next, as shown in FIG. 11A, the second insulative layer 39 is laminated on the first insulative layer 36 to cover the second wiring layer 38. For example, the second insulative layer 39 is formed by pressure bonding a resin film on the first insulative layer 36.

Then, as shown in FIG. 11B, the via holes 39X are formed in the first insulative layer 36 and the second insulative layer 39 at predetermined locations (locations where the pads 5 are formed) so as to extend through the insulative layers 36 and 39 and reach the lands L1 of the first wiring layer 33. The via holes 39X are formed to expose the coupling portions 38A of the second wiring layer 38, that is, at locations facing the coupling portion 38A of the second wiring layer 38. Here, the width W1 of the coupling portions 38A of the second wiring layer 38 facing the via holes 39X is smaller than the diameter D1 (refer to FIG. 5A) of the via holes 39X.

The via holes 39X are formed, for example, through laser processing. For example, $CO_2$ laser, excimer laser, YAG laser, or the like can be used as the laser.

A seed layer (not shown) is then formed on the second insulative layer 39 and the walls of the via holes 39X. As shown in FIG. 11C, electrolyte copper plating (panel plating) that uses the seed layer as a power supplying layer is performed to form a copper plated layer 40A on the second insulative layer 39 and in the via holes 39X. Then, as shown in FIG. 12A, a copper plated layer 40A that projects out of the upper surface of the second insulative layer 39 is polished through chemical mechanical polishing (CMP) or the like to form each via 40 with an upper surface that is flush with the upper surface of the second insulative layer 39. This exposes the upper surface of the via 40 from the second insulative layer 39 as the pad 5. In this state, the via 40 is connected to the corresponding land L1 of the first wiring layer 33. Further, the intermediate portion of the via 40 in the thicknesswise direction of the via 40 is connected to the corresponding coupling portion 38A of the second wiring layer 38 by a landless structure. In this manner, the wiring substrate 2 of the present embodiment is manufactured.

In the present embodiment, the wiring layers 33 and 38 and the insulative layers 36 and 39, which respectively cover the wiring layers 33 and 38, are formed. Then, the via holes 39X having a larger diameter than the coupling portions 38A of the wiring layer 38 are formed extending through the insulative layers 36 and 39. Further, the via holes 39X are filled with conductive layer (copper plated layer) to form the vias 40 which serve as the pads 5. Thus, each coupling portion 38A of the second wiring layer 38 is connected to the corresponding via 40 by a landless structure.

The semiconductor chip 3 is then mounted on the wiring substrate 2, which is manufactured as described above. In the present example, the bumps 4 of the semiconductor chip 3 are flip-chip joined with the pads 5 of the wiring substrate 2, as shown in FIG. 12B. In this manner, the semiconductor device 1 of the present embodiment is manufactured.

The present embodiment has the advantages described below.

(1) The second wiring layer 38 is arranged at an intermediate portion of the via 40 in the thicknesswise direction of the via 40, and the coupling portion 38A of the second wiring layer 38 is connected to the via 40 by a landless structure. This enlarges the region in which the second wiring layer 38 is arranged, that is, increases the width WA between the vias 40. Thus, a larger area of the second wiring layer 38 is arranged in the region between the vias 40 (pads 5). This increases the wire density.

(2) In the present embodiment, the via holes 36X and 39X are formed through laser processing. Thus, a non-photosensitive resin (e.g., thermo-setting resin) may be used as the material for the insulative layers 36 and 39. A thermo-setting resin has higher reliability related to heat resistance and chemical resistance than a photosensitive resin, which is generally used as the solder resist layer. Accordingly, when thermo-setting resin is used as the material for the insulative layers 36 and 39, the reliability related to heat resistance and chemical resistance is improved compared to when only photosensitive resin can be used as the material for the insulative layers 36 and 39.

It should be apparent to those skilled in the art that the present invention may be embodied in many other specific forms without departing from the spirit or scope of the invention. Particularly, it should be understood that the present invention may be embodied in the following forms.

Figure 13A:
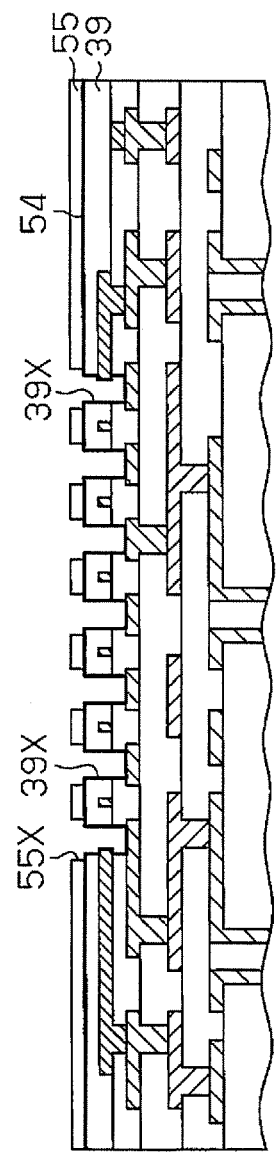
FIGS. 13A to 13C are schematic cross-sectional views showing a method for manufacturing a modified semiconductor device.
Figure 13B:
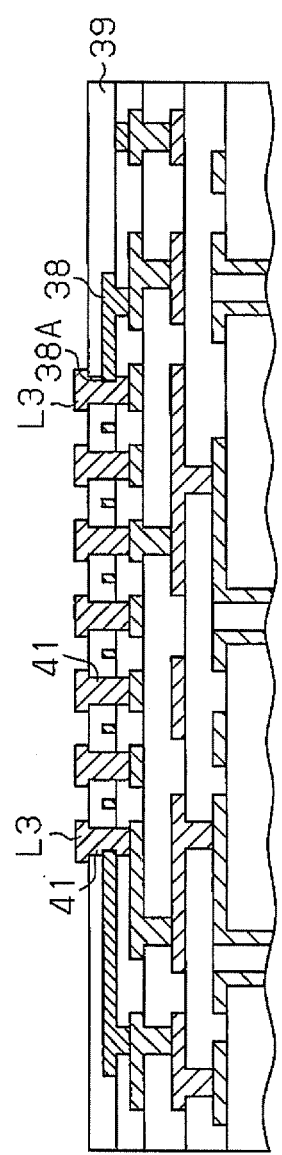
Figure 13C:
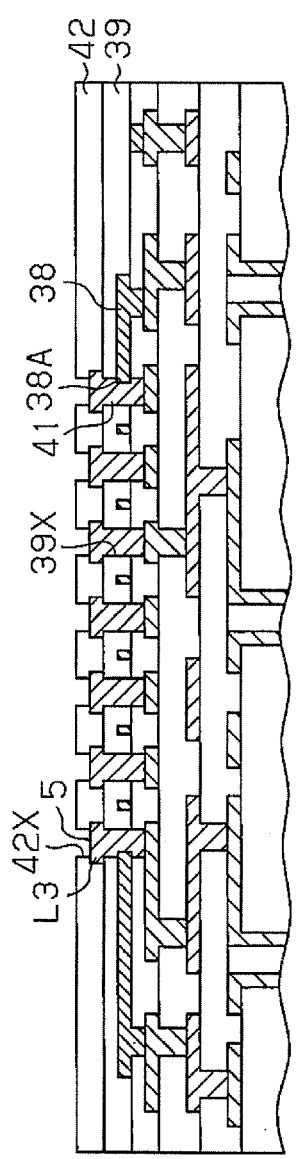

In the embodiment described above, the vias 40 are embodied as landless vias but not limited in such a manner. For example, as shown in FIG. 13B, vias 41 including lands L3 having a larger diameter than the vias 41 may be formed. Each of the lands L3 is an example of a second land. In this case, the via holes 39X are formed in the manufacturing step shown in FIG. 11B, and then a seed layer 54 is formed on the insulative layer 39 and the walls of the via holes 39X, as shown in FIG. 13A. Further, a DFR 55 including openings 55X corresponding to the shape of the lands L3 is formed on the seed layer 54. Then, as shown in FIG. 13B, electrolyte copper plating that uses the seed layer 54 as a power supplying layer is performed to fill the via holes 39X and the opening 55X of the DFR 55 with copper plating and form the vias 41 including the lands L3 having a diameter that is larger than the via diameter. Afterward, as shown in FIG. 13B, the DFR 55 is removed and the unnecessary seed layer 54 is etched and removed. Further, as shown in FIG. 13C, a third insulative layer (solder resist layer 42) is formed to cover the lands L3, and a photolithography process is performed to expose and develop the solder resist layer 42. This forms the openings 42X and exposes part of each land L3 as the pad 5. In such a structure, each coupling portion 38A of the second wiring layer 38 is connected to the corresponding via 41 by a landless structure, and the same advantages as the above embodiment are obtained.

When using the structure shown in FIG. 13, the vias 41 (via holes 39X) may have a smaller diameter than the pads 5. This enlarges the region in which the second wiring layer 38 can be arranged, that is, the width between the vias 41 can be increased from the embodiment described above.

Figure 14A:
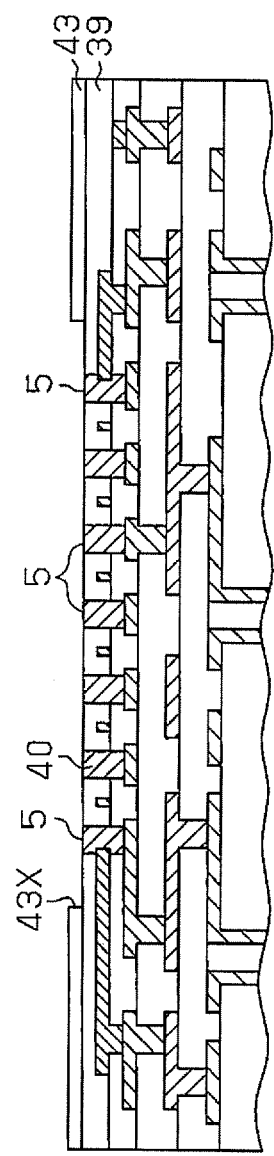
FIGS. 14A and 14B are schematic cross-sectional views showing a method for manufacturing the modified semiconductor device.
Figure 14B:
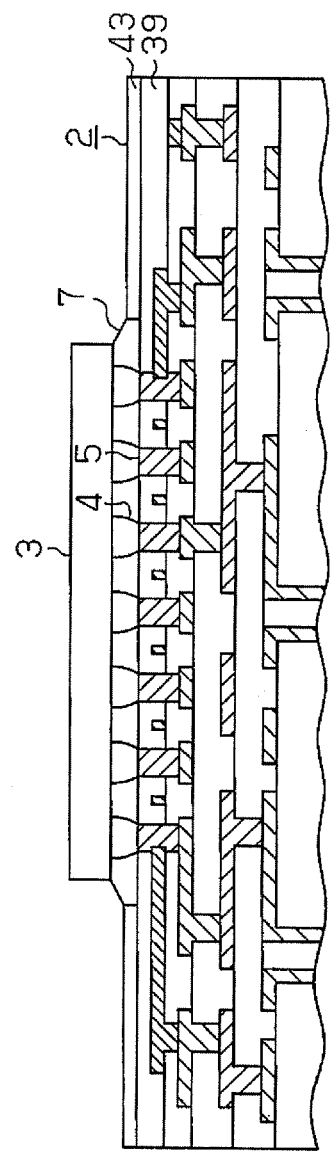

In the embodiment described above, for example, a third insulative layer (solder resist layer 43) may be further formed on the second insulative layer 39 as shown in FIG. 14A, after forming the via 40 in the manufacturing step shown in FIG. 12A. In the solder resist layer 43 shown in FIG. 14A, to expose the pads 5, the openings 43X are formed in the region in which the pads 5 are formed. In this case, as shown in FIG. 14B, the bumps 4 of the semiconductor chip 3 are flip-chip joined to the pads 5. Then, the underfill resin 7 is filled between the wiring substrate 2 and the semiconductor chip 3. Subsequently, the underfill resin 7 is cured and solidified through a heating process. This protects the portions when the pads 5 and bumps 4 are connected from the exterior and improves the mounting reliability. In this case, even if the underfill resin 7 flows outward from the region in which the pads 5 are formed, the underfill resin 7 can be held back by the solder resist layer 43. This prevents the underfill resin 7 from contaminating other mounting pads and the like.

The solder resist layer 43 does not necessarily need to be formed extending to the periphery (side wall) of the wiring substrate 2 to hold back the underfill resin 7. In other words, the solder resist layer 43 only needs to have a width capable of holding back the underfill resin 7.

In the embodiment described above, the lands L2 of the second wiring layer 38 arranged on the vias 37 have a larger diameter than the vias 37. However, the present invention is not limited in such a manner, and the lands L2 of the second wiring layer 38 may have a smaller diameter than the vias 37.

In FIGS. 4 to 14, the vias 40 and 41 (via holes 39X) have a straight shape. However, the vias 40 and 41 (via holes 39X) may have a tapered shape in which the diameter decreases from the upper part toward the lower part.

In the embodiment described above, the via holes 39X are formed through laser processing but not limited in such a manner. For example, the via holes 39X may be formed by performing a blasting process.

In the embodiment described above, there is only one second wiring layer 38. However, there may be a plurality of second wiring layers 38.

In the embodiment described above, the wiring substrate 2 includes the pads 5, which are arranged in a matrix as viewed from above, but is not limited in such a manner. For example, the wiring substrate may include pads arranged in its peripheral portion.

In the embodiment described above, the semiconductor chip 3 is mounted on the wiring substrate 2. However, the mounted electronic component is not limited to the semiconductor chip 3. For example, the present invention can be applied to a flip-chip mounting type package (package on package) having a structure in which another wiring substrate is laminated on the wiring substrate 2.

In the embodiment described above, the structure of the lower layer of the first wiring layer 33 is not particularly limited. For example, the structure and the material of the core substrate 10 are not particularly limited. Further, the number of lower wiring layers formed on the core substrate 10 and the insulative layers covering the wiring layers are not particularly limited.

The present examples and embodiments are to be considered as illustrative and not restrictive, and the invention is not to be limited to the details given herein, but may be modified within the scope and equivalence of the appended claims.

The invention claimed is:

1. A wiring substrate comprising:
a first wiring layer including a first land;
a first insulative layer formed on the first wiring layer;
a second wiring layer formed on the first insulative layer;
a second insulative layer formed on the second wiring layer; and
a via filled in a via hole, the via hole being formed continuously penetrating completely through both the first insulative layer and the second insulative layer in a thicknesswise direction to expose the first land of the first wiring layer, wherein
the via is a landless via, wherein the landless via includes a lower end face, which is supported by and electrically connected to the first land of the first wiring layer, and an upper end face, which is located opposed to the lower end face and exposed from an upper surface of the second insulative layer,
the upper end face of the landless via serves as a semiconductor chip connection pad to which one of a plurality of bump electrodes arranged on a circuit formation surface of a semiconductor chip is directly and electrically flip-chip connected,
the landless via is one of a plurality of landless vias that are arranged in a grid in at least a central portion of a mounting region in which the semiconductor chip is mounted on the wiring substrate,
the second wiring layer includes a coupling portion projecting into the via hole to be electrically and directly connected to the landless via, wherein
the coupling portion of the second wiring layer is an end of the second wiring layer,
a wiring width of the coupling portion of the second wiring layer is smaller than a diameter of the landless via in a plan view, and
a wiring length of the coupling portion which is electrically connected to the landless via is smaller than the diameter of the landless via in the plan view, and
the landless via is filled into the via hole to cover a wall of the via hole, the first land exposed in the via hole, and the coupling portion projecting into the via hole.

2. The wiring substrate according to claim 1, wherein the upper end face of the landless via is flush with the upper surface of the second insulative layer.

3. The wiring substrate according to claim 1, wherein the first insulative layer and the second insulative layer are formed from a non-photosensitive resin material.

4. The wiring substrate according to claim 1, wherein the second wiring layer is arranged to pass between adjacent ones of the vias.

5. The wiring substrate according to claim 1, wherein
the coupling portion of the second wiring layer is connected to an intermediate portion between the lower end face and the upper end face of the landless via in the thicknesswise direction.

6. The wiring substrate according to claim 1, wherein
the second insulative layer is an uppermost insulative layer in the wiring substrate,
the second wiring layer is an uppermost wiring layer in the wiring substrate and is located below the upper surface of the uppermost insulative layer,
the upper end face of the landless via is exposed from and flush with the upper surface of the uppermost insulative layer, and
the uppermost wiring layer is connected to the landless via at a position lower than the upper end face of the landless via.

7. The wiring substrate according to claim 1, wherein the mounting region aligns with a central portion of the circuit formation surface of the semiconductor chip when mounted.

8. The wiring substrate according to claim 1, wherein
the semiconductor chip connection pad is one of a plurality of semiconductor chip connection pads,
the second wiring layer includes a redistribution wire that is electrically connected to a first semiconductor chip connection pad of the plurality of semiconductor chip connection pads, and
the redistribution wire extends from the first semiconductor chip connection pad and passes between outer ones of the plurality of semiconductor chip connection pads located in a region outward from the first semiconductor chip connection pad.

9. The wiring substrate according to claim 1, wherein
the coupling portion is one of a plurality of coupling portions formed in the second wiring layer, and
each of the plurality of coupling portions is connected to one of the plurality of landless vias.

10. A semiconductor device comprising:
a semiconductor chip including a circuit formation surface on which a plurality of bump electrodes are arranged; and a wiring substrate, the wiring substrate including:
a first wiring layer including a land;
a first insulative layer formed on the first wiring layer;
a second wiring layer formed on the first insulative layer;
a second insulative layer formed on the second wiring layer; and
a via filled in a via hole, the via hole being formed continuously penetrating completely through both the first insulative layer and the second insulative layer in a thicknesswise direction to expose the first land of the first wiring layer, wherein
the via is a landless via, wherein the landless via includes a lower end face, which is supported by and electrically connected to the land of the first wiring layer, and an upper end face, which is located opposed to the lower end face and exposed from an upper surface of the second insulative layer,
the upper end face of the landless via serves as a semiconductor chip connection pad to which one of the plurality of bump electrodes on the circuit formation surface of the semiconductor chip is directly and electrically flip-chip connected,
the landless via is one of a plurality of landless vias that are arranged in a grid in at least a central portion of a mounting region in which the semiconductor chip is mounted on the wiring substrate,
the second wiring layer includes a coupling portion projecting into the via hole to be electrically and directly connected to the landless via, wherein
the coupling portion of the second wiring layer is an end of the second wiring layer,
a wiring width of the coupling portion of the second wiring layer is smaller than a diameter of the landless via in a plan view, and
a wiring length of the coupling portion which is electrically connected to the landless via is smaller than the diameter of the landless via in the plan view, and
the landless via is filled into the via hole to cover a wall of the via hole, the first land exposed in the via hole, and the coupling portion projecting into the via hole.

11. The semiconductor device according to claim 10, wherein
the coupling portion of the second wiring layer is connected to an intermediate portion between the lower end face and the upper end face of the landless via in the thicknesswise direction.

12. The semiconductor device according to claim 10, wherein
the second insulative layer is an uppermost insulative layer in the wiring substrate,
the second wiring layer is an uppermost wiring layer in the wiring substrate and is located below the upper surface of the uppermost insulative layer,
the upper end face of the landless via is exposed from and flush with the upper surface of the uppermost insulative layer, and
the uppermost wiring layer is connected to the landless via at a position lower than the upper end face of the landless via.

\* \* \* \* \*